United States Patent
Whittaker et al.

(10) Patent No.: US 6,903,608 B2
(45) Date of Patent: Jun. 7, 2005

(54) POWER LEVEL CONTROLLING OF FIRST AMPLIFICATION STAGE FOR AN INTEGRATED RF POWER AMPLIFIER

(75) Inventors: Edward J. W. Whittaker, Bishops (GB); Christopher A. Zelley, Lowerwick (GB)

(73) Assignee: SiGe Semiconductor Inc., Ottawa (CA)

( * ) Notice: Subject to any disclaimer, the term of this patent is extended or adjusted under 35 U.S.C. 154(b) by 43 days.

(21) Appl. No.: 10/695,767

(22) Filed: Oct. 30, 2003

(65) Prior Publication Data

US 2005/0093630 A1 May 5, 2005

(51) Int. Cl.[7] ............................................. H03F 3/45
(52) U.S. Cl. ...................... 330/254; 330/285; 330/310
(58) Field of Search ............................. 330/254, 285, 330/310

(56) References Cited

U.S. PATENT DOCUMENTS

| | | | |
|---|---|---|---|
| 4,952,867 A | * | 8/1990 | Anderson et al. ........... 323/273 |
| 5,483,390 A | * | 1/1996 | Jaffard et al. .................. 360/62 |
| 5,942,946 A | * | 8/1999 | Su et al. ...................... 330/310 |
| 6,750,719 B2 | * | 6/2004 | Toyota et al. ............... 330/285 |

* cited by examiner

Primary Examiner—Patricia Nguyen
(74) Attorney, Agent, or Firm—Kenyon & Kenyon

(57) ABSTRACT

A power amplifier circuit is disclosed having a first amplification stage and a second amplification stage. The first amplification stage is biased using a controllable current source that provides a variable bias current thereto. A control circuit is provided for controlling the variable bias current in dependence upon the supply voltage and temperature of the power amplifier circuit. The control signal varies the variable bias current in dependence upon the supply voltage varying between first and second potential, where each potential supplies sufficient potential for operation of the power amplifier circuit.

32 Claims, 7 Drawing Sheets

POWER LEVEL CONTROLLING OF FIRST AMPLIFICATION STAGE FOR AN INTEGRATED RF POWER AMPLIFIER

FIELD OF THE INVENTION

The invention relates to the field of power amplifier circuits and more specifically to the field of controlling of amplification stages forming a power amplifier in order to attain a predetermined range of output signal power.

BACKGROUND OF THE INVENTION

For many applications, Radio Frequency (RF) Power Amplifiers (PAs) are required to have an output signal power that is independent of PA supply voltage and PA operating temperature.

Prior art PA circuits generally have a first stage that is supplied with a ramped voltage supply that is used to control an output signal of the first stage in a controllable manner. Unfortunately, a disadvantage of the old technology is that fine control for controlling of amplitude of the output signal is not easily attained. A collector emitter saturation voltage of the first stage RF transistor, or transistors, limits the first stage output signal. At saturation, the amplitude of the output signal is hard to predict with any great accuracy. As a result, this does not provide an overall PA output signal amplitude with accuracy. This poses a particular problem when the supply voltage is very low in potential and the variability of the saturation of the PA amplification stages significantly alters the power output capability. As a result, a closely controlled PA output signal level is not readily obtained. Typically, the maximum output signal power of the PA is proportional to the supply voltage or a significant efficiency penalty is suffered. Having the output signal power vary upon power supply variations is unacceptable for many applications.

In cellular telephone handsets and other wireless applications, because of battery power there is provided to circuitry therein a particularly wide range of supply voltages. As a result, there is a considerable difference between the PA supply voltage when a cellular telephone handset battery is fully charged and significantly discharged.

A need therefore exists to provide circuitry that during operation thereof provides a RF output signal that is approximately independent of the actual supply voltage potential. It is therefore an object of the invention to provide an input stage for an integrated PA with a more accurately controllable output signal power than is currently attainable in the state of the art.

SUMMARY OF THE INVENTION

In accordance with the invention there is provided a power amplifier circuit comprising: an input port for receiving a RF input signal; an output port for providing therefrom a RF output signal, the RF output signal being an amplified version of the RF input signal; a supply voltage input port for receiving a supply voltage; a controllable current source having an input port for receiving a control signal and an output port for providing of a variable bias current therefrom, the variable bias current based upon the control signal; a first amplification stage having a first variable gain and for receiving the RF input signal and for providing a first amplified RF signal, the first amplification stage coupled to the controllable current source for receiving the variable bias current therefrom and for having the first variable gain thereof varied in proportion to the variable bias current; a second amplification stage having a second gain and coupled to the first amplification stage for receiving the first amplified RF signal and coupled to the output port for providing the output signal thereto; and, a control circuit for generating the control signal for provision to the controllable current source, the control signal for being generated in dependence upon the supply voltage, where for the supply voltage having a first potential the variable bias current provided to the first amplification stage is smaller than for the supply voltage having a second potential that is lower than the first potential.

In accordance with the invention there is provided a circuit for biasing a power amplifier circuit comprising a first amplification stage and a second amplification stage, the circuit comprising: a current source comprising: a current source input port for receiving a control signal, and an output port for providing a variable bias current in dependence upon the control signal; and, a current source control circuit comprising: a supply voltage input port for receiving of a supply voltage, a control signal output port coupled to the current source input port for providing of the control signal to the current source, and current control circuitry for sensing a potential of the supply voltage at the supply voltage input port and for generating the control signal, where the control signal is for resulting in an increasing variable bias current with a decreasing supply voltage sensed on the supply voltage input port which results in the second amplification stage to transition from a linear mode of operation to a saturation mode of operation.

In accordance with the invention there is provided a method of amplifying a RF input signal to form a RF output signal comprising the steps of: sensing of a supply voltage potential; determining whether the sensed supply voltage potential is one of higher than a first predetermined potential, in between the first predetermined potential and a second predetermined potential and below the second predetermined potential; amplifying the RF input signal with a first amplification stage having a first variable gain to form a first amplified signal, the first variable gain dependent upon the sensed supply voltage potential; amplifying the first amplified signal with a second amplification stage having a second gain to form the RF output signal; adjusting a bias current provided to the first amplification stage for varying the first variable gain in such a manner that at the first predetermined potential a lower bias current is provided to the first amplification stage than is provided to the first amplification stage at the second predetermined potential, the lower bias current for operating of the second amplification stage in a linear mode of operation and a higher bias current for operating of the second amplification stage in a saturation mode of operation.

BRIEF DESCRIPTION OF THE DRAWINGS

Exemplary embodiments of the invention will now be described in conjunction with the following drawings, in which:

FIG. 1b broadly outlines operating steps of the amplifier circuit shown in FIG 1a;

DETAILED DESCRIPTION OF EMBODIMENT OF THE INVENTION

Figure 1A:
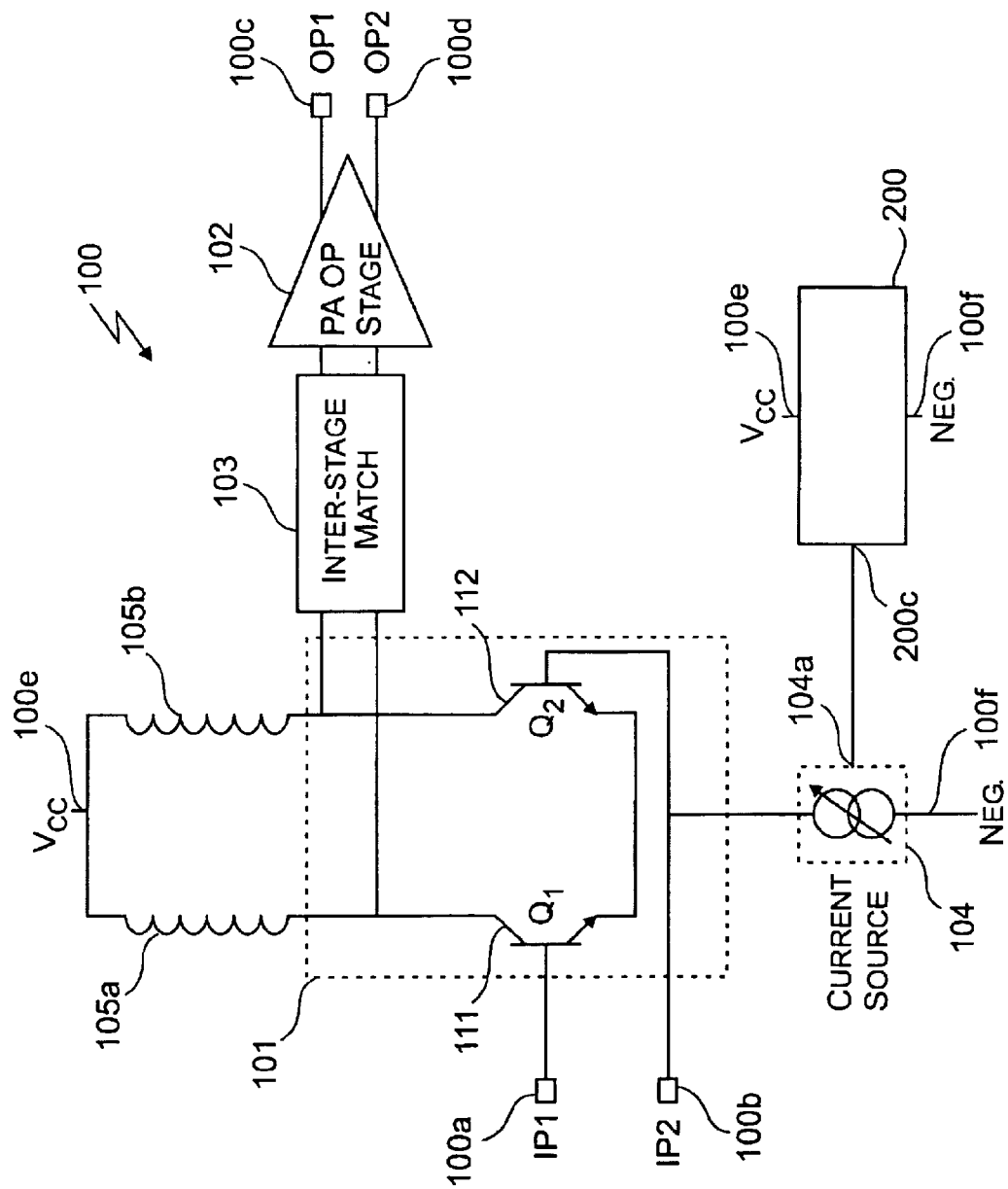
FIG. 1a illustrates a power amplifier circuit having an input amplification stage and an output amplification stage in accordance with a first embodiment of the invention.

FIG. 1 illustrates a power amplifier circuit 100 having a first amplification stage 101 and a second amplification stage 102 in accordance with a first embodiment of the invention. A first inter stage matching circuit 103 is disposed between the two stages, 101 and 102, for matching of impedance of connected ports therebetween. First and second output ports, 100c and 100d, of the second amplification stage 102 provide first and second RF output signals. The first amplification stage 101 is formed from a first transistor 111 and a second transistor 112, where a base terminal of the first transistors 111 serves as a first input port 100a and a base terminal of the second transistor 112 serves as a second input port 100b. Each transistor, 111 and 112, is disposed between a controllable current source 104 and a respective reactive element 105a and 105b, where the first and second reactive elements, 105a and 105b, are connected between the collector terminals of the first and second transistors, 11 and 112, and a first supply voltage input port 100e. The controllable current source 104 is disposed between a second supply voltage input port 100f and the emitter terminals of the two transistors, 111 and 112. A control port 104a is provided on the controllable current source 104 for receiving a control current (Icontrol) from an output port 200c of the control circuit 200 (FIG. 2a, FIG. 2b), in accordance with second and third embodiments of the invention, respectively. The control circuit 200 is disposed between the first and second supply voltage input ports and is optionally provided with an enable port 200e (FIG. 2b) for enabling and disabling thereof by an external source (not shown).

Figure 2A:
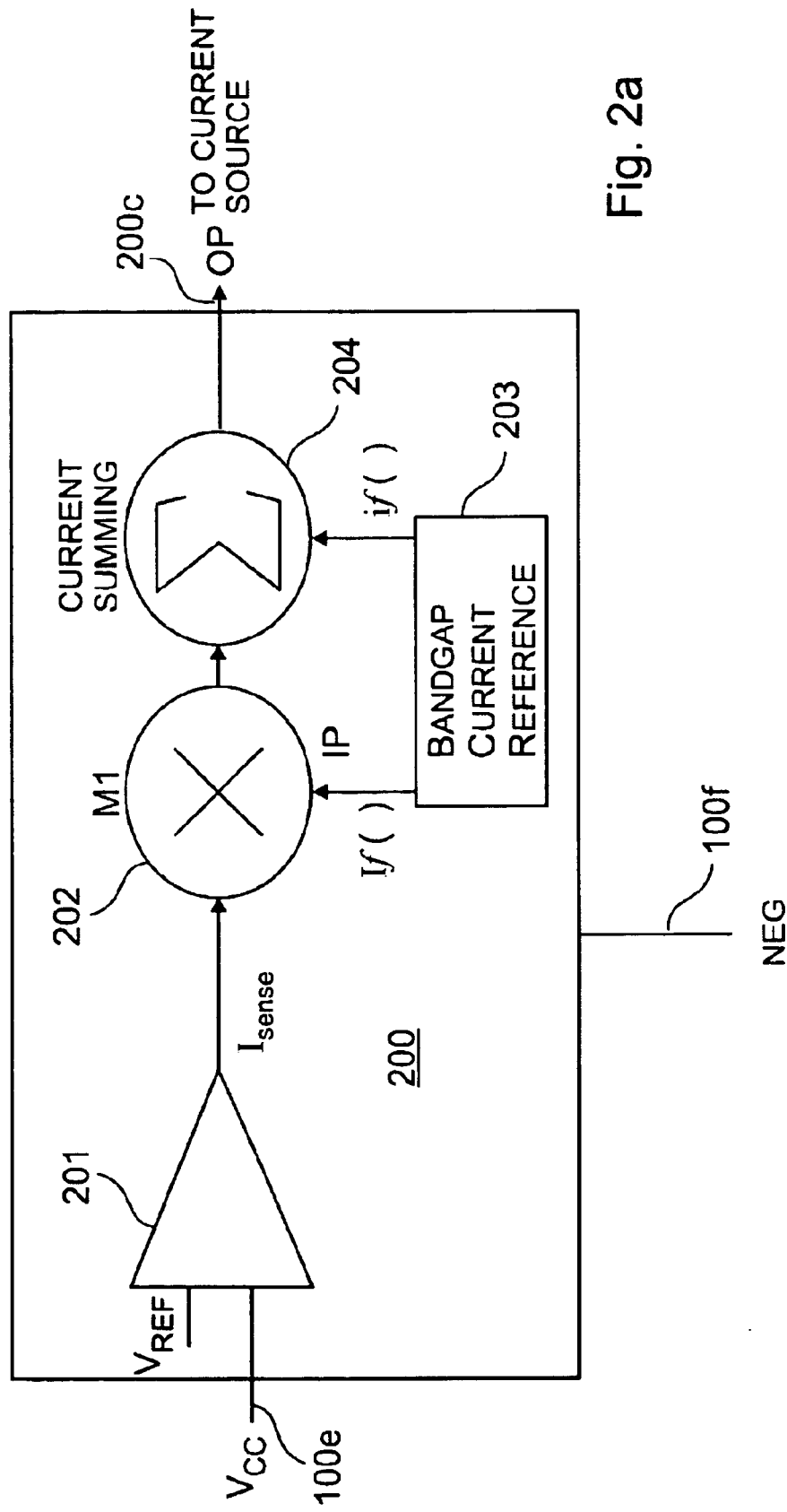
FIG. 2a illustrates the control circuit, in accordance with a second embodiment of the invention, for controlling a controllable current source used for providing a bias current to the first amplification stage.

The primary focus of the embodiments of the invention is the control circuit 200 (FIG. 2a) and control circuit 220 (FIG. 2b) and their use in controlling of the controllable current source 104. FIG. 2a illustrates the control circuit 200 in accordance with a second embodiment of the invention. The control circuit 200 is comprised of the following circuit blocks: a supply voltage sense circuit 201, a first multiplier circuit 202, a bandgap reference circuit 203, and a current summing circuit 204.

The supply voltage sense circuit 201 has a first input port connected to the first supply voltage input port 100e for sensing a potential of the first supply voltage (Vcc) applied thereto relative to a reference voltage from a reference source (not shown) provided to a second input port thereof. An output port of the supply voltage sense circuit 201 is used for providing a sense signal (Isense) (302 FIG. 3a) to a first input port of a first multiplier circuit (M1) 202. Preferably M1 202 is in the form of a Gilbert cell multiplier. M1 202 additionally includes a second input port and an output port. The second input port thereof is for receiving of a first reference current If(θ) and the output port thereof is for providing a first current to a first input port of the current summing circuit 204. Within the current summing circuit 204 the second reference current is summed with a portion of the first reference current to form a summed current that is provided from an output port thereof. A portion of the first reference current that forms the summed current is dependent upon the sense signal (Isense) 302. In this second embodiment of the invention, the output port of the current summing circuit 204 is directly connected to the output port 200c of the control circuit.

The bandgap current reference circuit 203 is disposed in order to provide the first reference current (If(θ)) to the second input port of the first multiplier circuit 202 and to provide a second reference current if(θ) to a second input port of the current summing circuit 204. First and second reference currents provided from the bandgap current reference circuit 203 are preferably temperature controlled with a controlled temperature coefficient of approximately 20% PTAT.

Figure 1B:
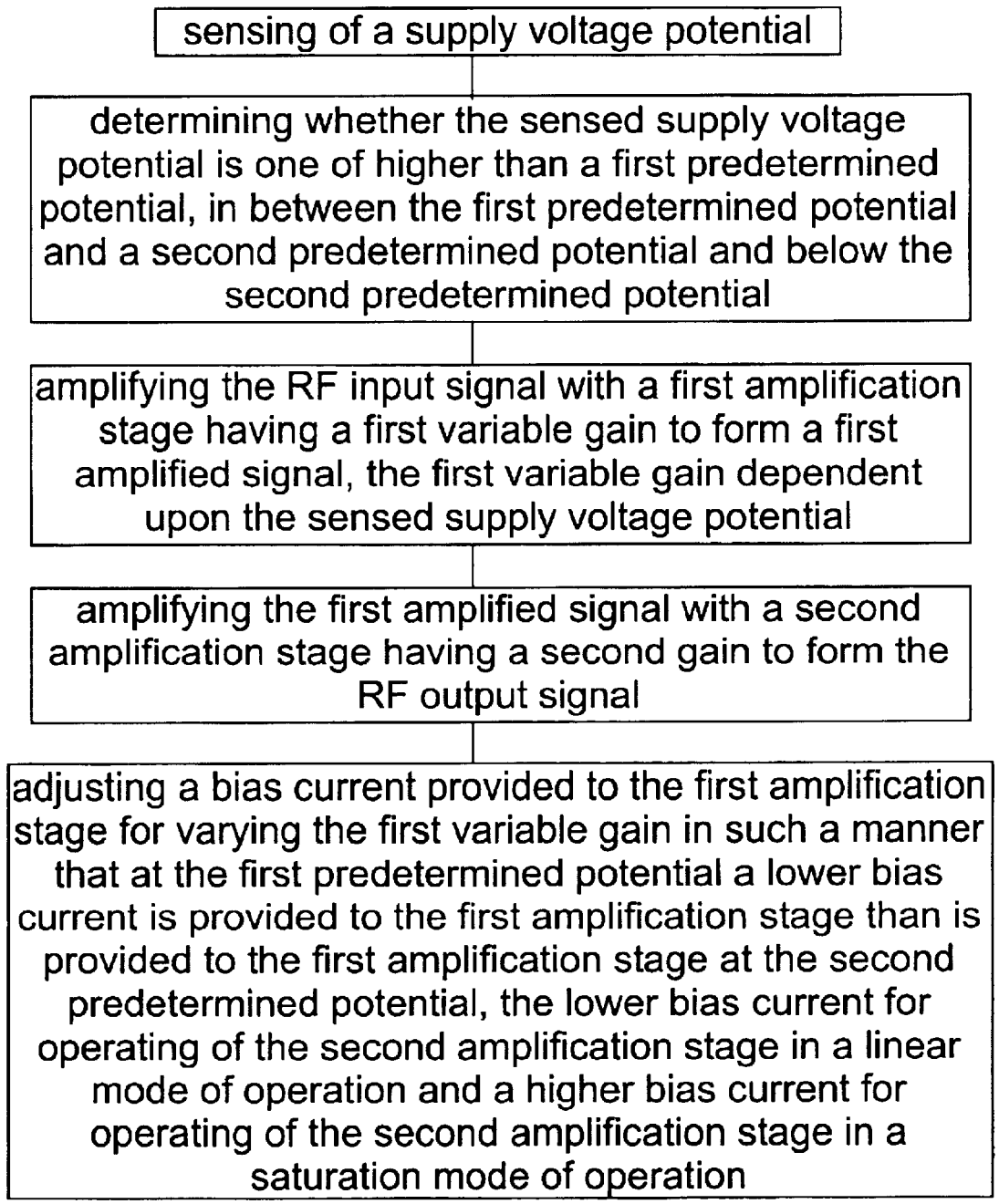

Broadly, the amplifier circuit illustrated in FIG. 1a operates according to the following operating steps, as illustrated in FIG. 1b. In a first step, 181, the sense circuit 201 performs sensing of a supply voltage potential. A determination is then performed, in step 182, as to whether the sensed supply voltage potential is one of higher than a first predetermined potential, in between the first predetermined potential and a second predetermined potential and below the second predetermined potential. In dependence upon the determination, step 183, the RF input signal is amplified using the first amplification stage 101 having the first variable gain to form the first amplified signal, where the first variable gain is dependent upon the sensed supply voltage potential. The first amplified signal is then further amplifier using the second amplification stage 102 having a second gain to form the RF output signal, in step 184. During operation of the power amplifier circuit 100 as the supply voltage potential changes, the bias current provided to the first amplification stage 101 for varying the first variable gain is adjusted in such a manner that at the first predetermined potential a lower bias current is provided to the first amplification stage 101 than is provided to the first amplification stage 101 at the second predetermined potential, the lower bias current for operating of the second amplification stage 102 in a linear mode of operation and a higher bias current for operating of the second amplification stage 102 in a saturation mode of operation, as outlined in step 185.

Figure 3A:
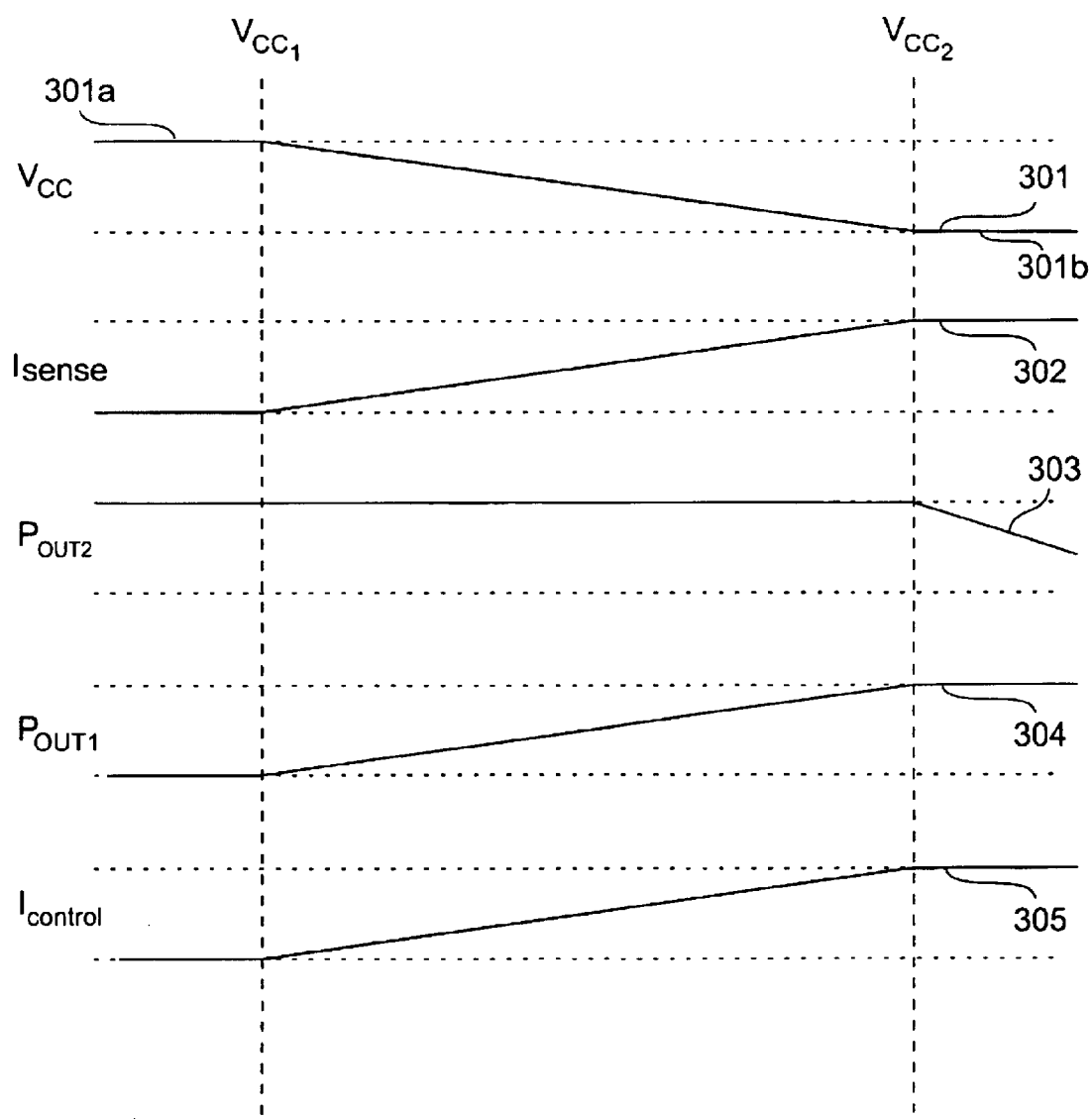
FIG. 3a illustrates a relationship between supply voltage potential (Vcc), a sense signal (Isense), output power provided from the first stage (Pout1), output power provided from the second amplification stage (Pout2), and a control signal (Icontrol) provided from the control circuit shown in FIGS. 2a or 2b.

FIG. 3a illustrates a supply voltage (Vcc) potential drop 301 from a maximum supply voltage potential 301a to a minimum supply voltage potential 301b, as well as the resulting signal power levels and current levels. The supply voltage potential drop is illustrated to be exemplary of a battery voltage drop. The supply voltage (Vcc) drop 301 includes two intermediate supply voltage potentials, Vcc1 and Vcc2. Above Vcc1, a battery, for example, which provides the supply voltage to the PA 100 is fully charged and has an approximate potential of over 2.5V. Between Vcc1 and Vcc2, the potential of the supply voltage drops to approximately 2V. Below Vcc2, the supply voltage potential drops to below approximately 2.0V.

For supply voltage potentials that are higher than the potential at Vcc1, the sense signal (Isense) 302 provided to the first multiplier circuit 202 is at a minimal level and as a result a minimal portion of the first reference current (If(θ)) is summed with the second reference current (if(θ)) in the current summing circuit 204 for forming the summed current. The output power (Pout1) 304 provided from the first amplification stage 101 to the second amplification stage 102 is at a minimal level and as a result the second amplification stage operates in a first mode of operation, that is a linear mode of operation. Output power provide from the second amplification stage 102 is indicated in FIG. 3a as Pout2 303 and is substantially constant until the power supply reaches the potential Vcc2.

Between Vcc1 and Vcc2, a controllable portion of the first reference current, (If(θ)), is propagated through the first multiplier circuit 202 and summed with the second reference current, (if(θ)). As the supply voltage potential 301 drops from Vcc1 to Vcc2, the sense signal (Isense) 302 increases in magnitude and an amount of the first reference current, (If(θ)), that is summed with the second reference current (if(θ)) increases. As a result, the output signal power (Pout1) 304 from the first amplification stage 101 increases with the increasing sense signal (Isense) 302. This increase in Pout1 304 compensates for the decrease in the supply voltage (Vcc) 301 in order to maintain the second stage output power (Pout2) 303 at a substantially constant power level. As the supply voltage declines between Vcc1 and Vcc2, the second amplification stage 102 smoothly transitions from the first mode of operation to a second mode of operation, where at Vcc2, the second amplification stage 102 only operates using the second mode of operation. The second mode of operation of the second amplification stage 102 is saturation, resulting from Pout1 304 being at a maximum. As the potential continues to drop, the second amplification stage 102 continues to operate in saturation, however, the output power (Pout2) 303 provided from the second amplification stage 102 drops in strength as a result of the supply voltage potential (Vcc) 301 decreasing past below the potential of Vcc2. Within the region of supply voltage potential (Vcc) 301 below Vcc2, the input and output amplification stages, 101 and 102, operate until the supply voltage potential (Vcc) 301 is at such a level that the power amplifier circuit 100 no longer operates.

In operation of the PA 100, the second amplification stage 102 is typically not operated at a full class 'A' compliance, but operated such that it provides a near constant power (Pout2) 303 when biased from its current source (not shown), which preferably provides a bias current thereto that is proportional to absolute temperature (PTAT). By providing the sense signal (Isense) 302 to the controllable current source 104 a corresponding bias current is provided to transistors, Q1 111 and Q2 112. This advantageously allows for a near constant output power (Pout2) 303 to be provided from the PA 100 over temperature, process and supply voltage (Vcc) variation. Over a range of input voltages for first and second input signals provided to the first and second input ports, 100a and 100b respectively, the first and second transistors Q1 111 and Q2 112 are fully switched by the input signals. As a result, the first and second output signals propagated from the first amplification stage 101 are independent of the first and second input signal levels.

Figure 2B:
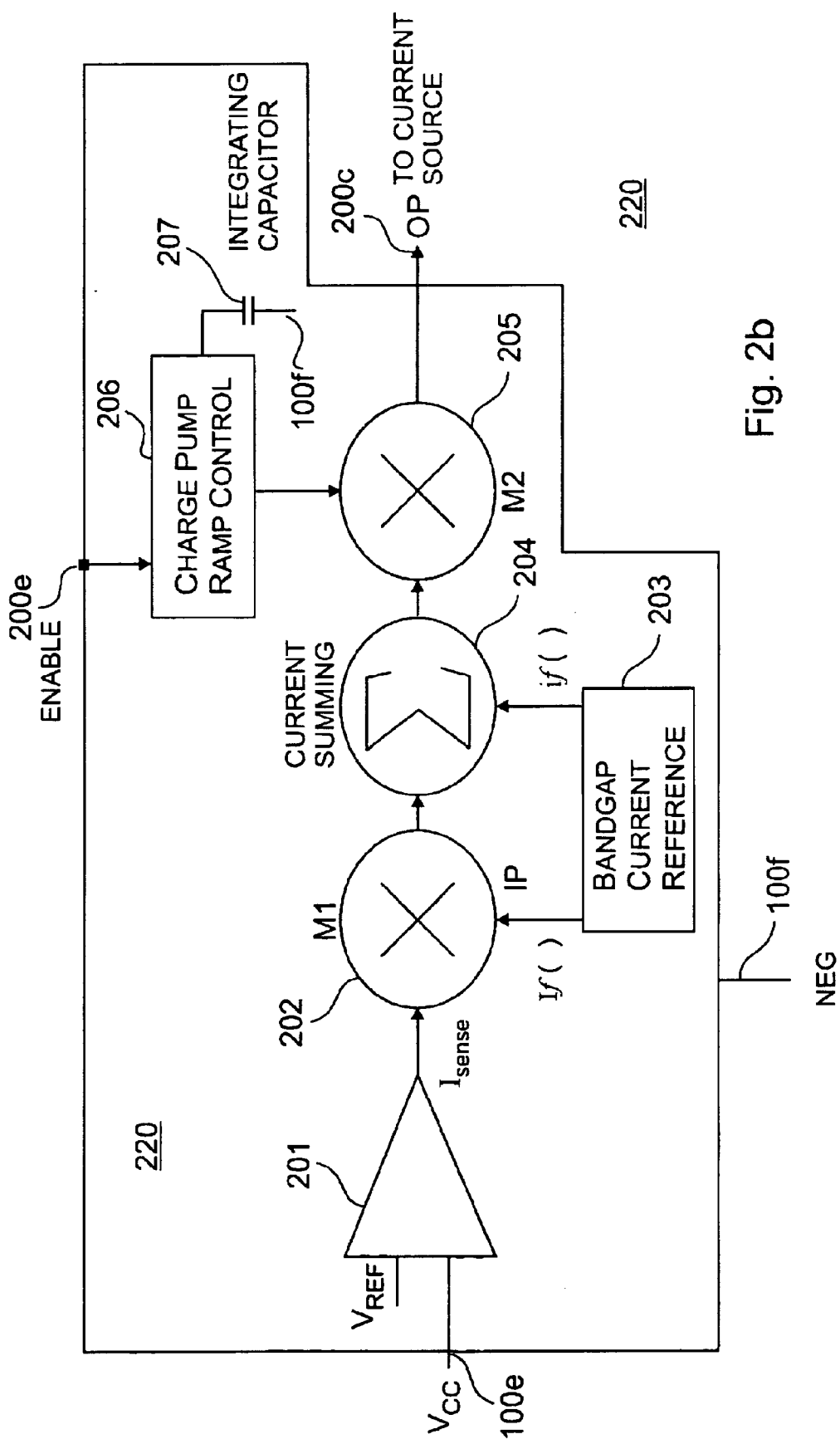
FIG. 2b illustrates the control circuit, in accordance with a third embodiment of the invention, for controlling a controllable current source used for providing a bias current to the first amplification stage using a charge pump and ramp control circuit as well as a second multiplier circuit.

FIG. 2b illustrates the control circuit 220 in accordance with the third embodiment of the invention. The control circuit 220 includes the circuitry of control circuit 200, but further comprises a second multiplier circuit 205, a charge pump and ramp control circuit 206 and an integrating capacitor 207. The second multiplier circuit 205 has a first input port, a second input port and an output port. Preferably the second multiplier circuit 205 is an analog multiplier circuit, preferably in the form of a Gilbert gain cell. The summed current provided from the output port of the current summing circuit 204 is provided to the first input port of the second multiplier circuit 205. The output port of M2 is directly connected to the output port 200c of the control circuit. An output signal from the second multiplier circuit 205 serves as the control signal (Icontrol) that is provided to the control port 104a of the controllable current source 104 used for biasing of transistors Q1 111 and Q2 112 (FIG. 1). The control signal (Icontrol) provided to the controllable current source 104 is directly proportional to the sense signal (Isense) provided from the supply voltage sense circuit 201 to the first input port of M1 202. The charge pump and ramp control circuit 206 receives the enable signal via the enable port 200e from an external source (not shown) and generates a ramp signal from an output port thereof that is connected to the second input port of M2 205. A capacitance of the integrating capacitor 207 determines characteristics of the ramp signal. Control circuit 220 is optionally used in place of control circuit 200 in the PA 100 of FIG. 1.

Figure 3B:
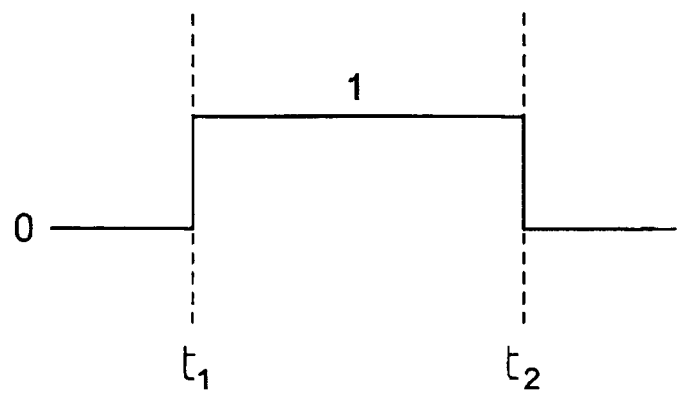
FIG. 3b illustrates a waveform of an enable signal applied to the enable port of the control circuit shown in FIG. 2b.
Figure 3C:
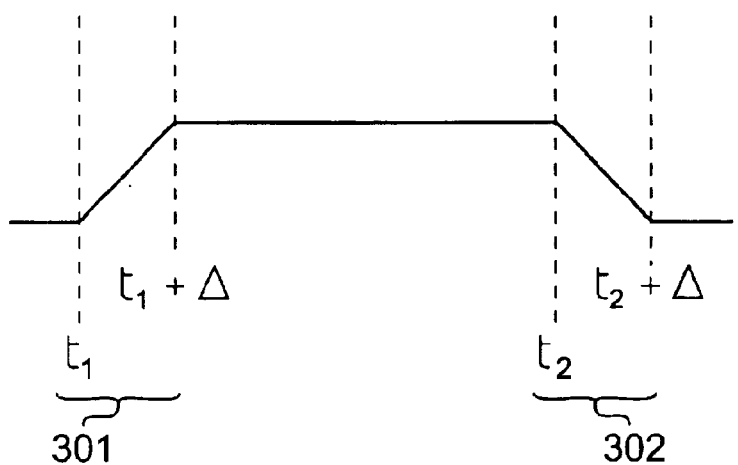
FIG. 3c illustrates a delayed turn on and a delayed turn off control signal provided from the control circuit shown in FIG. 2b.

The control circuit 220 provides a delayed turn on and a delayed turn off control signal, as shown in FIG. 3c, in response to the enable signal, shown in FIG. 3b, applied to its enable port 200e. At time t1, the enable signal experiences a first transition from logic LO to logic HI. This first transition results in the control signal (Icontrol) to experience a delayed ramp up from a first signal level to a second signal level, where the second signal level is achieved at a rise time of t1Δ. Once the enable signal experiences a second transition from logic HI to logic LO at time t2, the control signal experiences a delayed ramp down from the second signal level to the first signal level, having a fall time between times t2 and t2Δ. The ramp time (Δ), for both the rise time and the fall time, is determined by the integrating capacitor 207. Optionally, by deliberate mismatching characteristics of transistors that form the second multiplier circuit 205, a normally linear relationship thereof is distorted so that a start of an 'on' ramp 301 and the end of an 'off' ramp 302 are more gradual.

For example, for supply voltage potentials that are higher than Vcc1, approximately 40 mA is provided from the controllable current source 104 to the emitter terminals of transistors Q1 111 and Q2 112. At a lower supply voltage potential, Vcc2, approximately 80 mA of current is provided from the controllable current source 104 to the emitter terminals of transistors Q1 111 and Q2 112.

For a constant supply voltage provided to the supply voltage input ports, a small positive temperature coefficient for transistors Q1 and Q2 is preferable, such as 20% PTAT. In such a case, the output power (Pout1) of the first amplification stage 101 is approximately constant over temperature. This temperature coefficient of the first amplification stage 101 compensates for the performance variations of the second amplification stage 102 with temperature.

Current control of the first amplification stage is used to accurately control the output power (Pout1) provided from the first amplification stage 101 to the second amplification stage 102 over a wide range of output signal powers (Pout2). Additionally, by pre-characterizing of the second amplification stage 102, first order corrections are performable within the first amplification stage 101 for correcting variability within the second amplification stage 102 with respect to supply voltage and temperature variations. This degree of control is not possible with a voltage limited first amplification stage 101 and allows the PA 100 to operate very close to a regulatory maximum output signal power, thereby maximizing a transmitting range of the PA when used within a wireless transmitter such as those consistent with DECT or 2.4 GHz DSSS.

Figure 4:
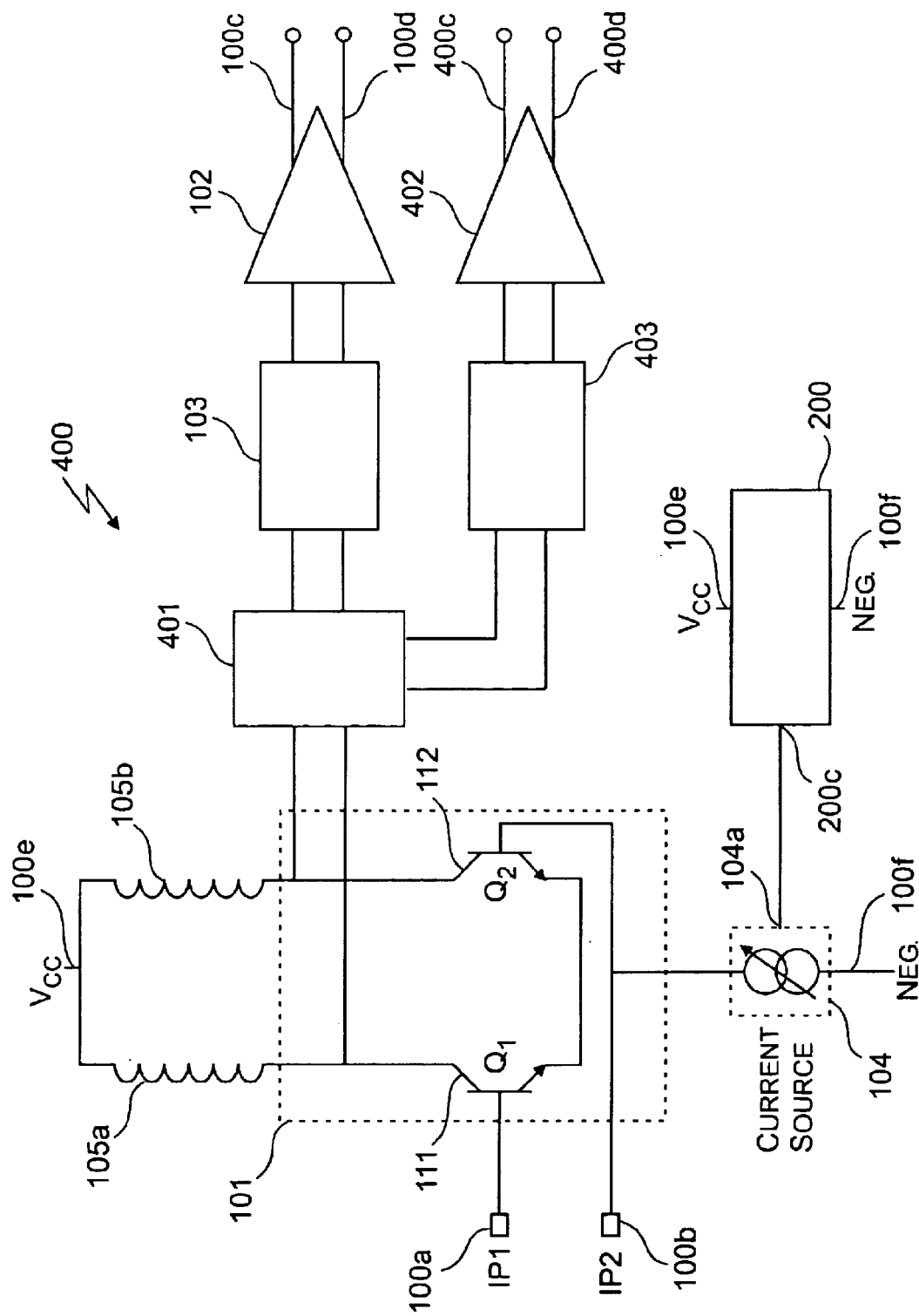

FIG. 4 illustrates a fourth embodiment of the invention, a PA 400 for operating at two different RF transmission standards. Circuit components designated by a number that is the same in FIG. 1 include similar circuitry and perform a similar function. In addition to the circuitry of FIG. 1, FIG. 4 comprises a switching circuit 401 a second inter stage matching circuit 403 and a third amplification stage 402. First and second output signals provided from the first amplification stage 101 are received by the switching circuit 401. In dependence upon an operating standard for the PA 400, either the second amplification stage 101 or the third amplification stage are switchably coupled to the first amplification stage for receiving of the output signal from the pair of transistors Q1 111 and Q2 112. For example, the second amplification stage 102 is for operating in compliance with the GSM standard and the third amplification stage is for operating in compliance with the CDMA standard. In dependence upon a standard at which the PA 400 is to be used, the switching circuit switchably selects the appropriate amplification stage. The second inter stage matching circuit 403 facilitates signal matching of input and output port characteristics of the third amplification stage to the first amplification stage 101. Otherwise, operation of the control circuit 200 for the fourth embodiment of the invention is similar to the operation of the control circuit for the first embodiment of the invention.

Figure 3D:
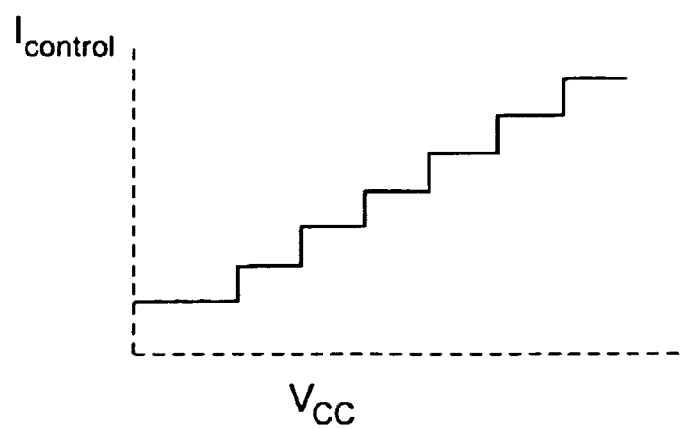
FIG. 3d illustrates a programmable control signal that is provided to a controllable current source for controlling a gain of the first amplification stage; and, FIG. 4 illustrates a fourth embodiment of the invention, a power amplifier circuit for operating in accordance with two different RF transmission standards.

Providing an input amplification stage 101 for an integrated PA 100 with a controllable output signal power achieves control of the output signal emitted from the PA output ports 100c and 100d. Optionally, the control circuit 220 provides a programmable control signal (Icontrol) (FIG. 3d) to the controllable current source 104. Programmable control of the controllable current source 104 advantageously provides for ramping of Pout1 in a controllable manner that generates low spuriae. Further advantageously, variability of the second amplification stage 102 with respect to supply voltage and temperature fluctuations is also reduced. This improved immunity of the PA to supply voltage and temperature fluctuations is achieved when the supply voltage potential is low and the second amplification stage 102 operates in saturation. Furthermore, setting of the PA output signal power regardless of the RF input signal power is also attainable by using this programming capability. Optionally, a lookup table (LUT) is disposed within the control circuit 220 for providing of the programmable control signal.

Advantageously, the embodiments of the invention allow for designing a PA in accordance with tight specification while still allowing operation of the PA well into saturation. PA efficiency is also advantageously maintained at low supply voltage potentials.

Numerous other embodiments may be envisaged without departing from the spirit or scope of the invention.

What is claimed is:

1. A power amplifier circuit comprising:
    an input port for receiving a RF input signal;
    an output port for providing therefrom a RF output signal, the RF output signal being an amplified version of the RF input signal;
    a supply voltage input port for receiving a supply voltage;
    a controllable current source having an input port for receiving a control signal and an output port for providing of a variable bias current therefrom, the variable bias current based upon the control signal;
    a first amplification stage having a first variable gain and for receiving the RF input signal and for providing a first amplified RF signal, the first amplification stage coupled to the controllable current source for receiving the variable bias current therefrom and for having the first variable gain thereof varied in proportion to the variable bias current;
    a second amplification stage having a second gain and coupled to the first amplification stage for receiving the first amplified RF signal and coupled to the output port for providing the output signal thereto; and,
    a control circuit for generating the control signal for provision to the controllable current source, the control signal for being generated in dependence upon the supply voltage, where for the supply voltage having a first potential the variable bias current provided to the first amplification stage is smaller than for the supply voltage having a second potential that is lower than the first potential.

2. A power amplifier circuit according to claim 1, where at the first potential the second amplification stage is for operating in an approximately linear mode of operation and at the second potential the second amplification stage is for operating in an approximately saturation mode of operation.

3. A power amplifier circuit according to claim 1, wherein the control circuit comprises a supply voltage sensing circuit having a first input port for sensing of a potential of the supply voltage, a second input port for receiving a reference voltage and having an output port for providing a sense signal therefrom, wherein the variable bias current is variable in proportion to the sense signal.

4. A power amplifier circuit according to claim 3, comprising a first multiplier circuit comprising at least a first input port connected to the supply voltage sense circuit for receiving the sense signal therefrom, a second input port for receiving a first reference current and having an output port for providing a first current therefrom.

5. A power amplifier circuit according to claim 4, comprising a bandgap current reference circuit having a first output port connected to the first multiplier circuit for providing the first reference current and a second output port for providing a second reference current.

6. A power amplifier circuit according to claim 5, comprising a current summing circuit having a first input port connected to the first multiplier circuit for receiving the first multiplier circuit output current therefrom, a second input port connected to bandgap current reference circuit for receiving the second reference current therefrom and an output port for providing a summed current therefrom, the summed current having a portion of the first current therein that is proportional to the sense signal.

7. A power amplifier circuit according to claim 1, comprising a first inter stage matching circuit, the first inter stage matching circuit disposed between the first amplification stage and the second amplification stage for providing of an impedance match therebetween.

8. A power amplifier circuit according to claim 1, comprising:
    a first inter stage matching circuit having output ports coupled to the second amplification stage input ports; and, a switching circuit having input ports coupled to output ports of the first amplification stage and a first set of output ports coupled to input ports of the first inter stage matching circuit, where the first inter stage matching circuit is for providing an impedance match between the first amplification stage, the switching circuit and the second amplification stage.

9. A power amplifier circuit according to claim 8, comprising:
a third amplification stage having input ports and output ports for providing an amplified version of the RF input signal therefrom; and,
a second inter stage matching circuit having output ports coupled to the third amplification stage input ports and having input ports coupled to a second set of output ports of the switching circuit, where the second inter stage matching circuit is for providing an impedance match between the first amplification stage, the switching circuit and the third amplification stage.

10. A power amplifier circuit according to claim 9, wherein the switching circuit is for controllably switching between providing the first amplified RF signal to one of the second amplification stage and the third amplification stage.

11. A power amplifier circuit according to claim 1, wherein the control circuit comprises a ramp circuit, the ramp circuit for generating of a ramp signal in dependence upon which the control signal is generated.

12. A power amplifier circuit according to claim 11, wherein the control circuit comprises an integrating capacitor, the integrating capacitor for operating in conjunction with the ramp circuit for determining a slope of the ramp signal.

13. A power amplifier circuit according to claim 12, wherein the control circuit comprises an enable port, the enable port for receiving of an enable signal for triggering of the ramp circuit for generating of the ramp signal, the ramp signal for rising from a first voltage level to a second voltage level during a rise time upon receiving a first transition of the enable signal.

14. A power amplifier circuit according to claim 12, wherein the control circuit comprises an enable port, the enable port for receiving of an enable signal for triggering of the ramp circuit for generating of the ramp signal, the ramp signal for falling from a second voltage level to a first voltage level during a fall time upon receiving a second transition of the enable signal.

15. A power amplifier circuit according to claim 1, wherein the power amplifier circuit comprises a temperature sensing circuit for sensing a temperature of a die on which the power amplifier circuit is formed.

16. A power amplifier circuit according to claim 1, wherein the power amplifier circuit is for use in wireless communication applications.

17. A circuit for biasing a power amplifier circuit comprising a first amplification stage and a second amplification stage, the circuit comprising:
a current source comprising:
a current source input port for receiving a control signal, and
an output port for providing a variable bias current in dependence upon the control signal; and,
a current source control circuit comprising:
a supply voltage input port for receiving of a supply voltage,
a control signal output port coupled to the current source input port for providing of the control signal to the current source, and
current control circuitry for sensing a potential of the supply voltage at the supply voltage input port and for generating the control signal, where the control signal is for resulting in an increasing variable bias current with a decreasing supply voltage sensed on the supply voltage input port which results in the second amplification stage to transition from a linear mode of operation to a saturation mode of operation.

18. A current source control circuit according to claim 17, comprising a supply voltage sensing circuit having a first input port for sensing of a potential of the supply voltage, a second input port for receiving a reference voltage and having an output port for providing a sense signal therefrom.

19. A current source control circuit according to claim 18 comprising a first multiplier circuit comprising at least a first input port connected to the supply voltage sense circuit for receiving the sense signal therefrom, a second input port for receiving a first reference current and having an output port for providing a first current therefrom.

20. A current source control circuit according to claim 19, wherein the first multiplier circuit comprises a Gilbert cell multiplier circuit.

21. A current source control circuit according to claim 19, comprising a bandgap current reference circuit having a first output port connected to the first multiplier circuit for providing the first reference current and a second output port for providing a second reference current.

22. A current source control circuit according to claim 21, comprising a current summing circuit having a first input port connected to the first multiplier circuit for receiving the first multiplier circuit output current therefrom, a second input port connected to bandgap current reference circuit for receiving the second reference current therefrom and an output port for providing a summed current therefrom, the summed current having a portion of the first current therein that is dependent upon the sense signal.

23. A current source control circuit according to claim 22, comprising
a second multiplier circuit comprising a first input port connected to the output port of the current sunning circuit for receiving of the summed current, a second input port for receiving a ramp signal and an output port connected to the control signal output port for providing the control signal to the current source.

24. A current source control circuit according to claim 23, comprising:
an integrating capacitor; and,
a charge pump and ramp control circuit comprising an enable port for receiving of an enable signal, a first input port for connecting to the integrating capacitor and an output port for providing the ramp signal to the second multiplier circuit.

25. A current source control circuit according to claim 24, wherein the ramp signal comprises a rise time and a fall time, where both the rise time and the fall time are dependent upon a capacitance of the integrating capacitor.

26. A method of amplifying a RF input signal to form a RF output signal comprising the steps of:
sensing of a supply voltage potential;
determining whether the sensed supply voltage potential is one of higher than a first predetermined potential, in between the first predetermined potential and a second predetermined potential and below the second predetermined potential;
amplifying the RF input signal with a first amplification stage having a first variable gain to form a first amplified signal, the first variable gain dependent upon the sensed supply voltage potential;

amplifying the first amplified signal with a second amplification stage having a second gain to form the RF output signal;

adjusting a bias current provided to the first amplification stage for varying the first variable gain in such a manner that at the first predetermined potential a lower bias current is provided to the first amplification stage than is provided to the first amplification stage at the second predetermined potential, the lower bias current for operating of the second amplification stage in a linear mode of operation and a higher bias current for operating of the second amplification stage in a saturation mode of operation.

27. A method according to claim 26, wherein between the first potential and the second potential the bias current provided to the first amplification increases with a decrease in the supply voltage potential.

28. A method according to claim 26, comprising the step of compensating for variability in the second gain of the second amplification stage in dependence upon the supply voltage variation by adjusting the bias current provided to the first amplification stage.

29. A method according to claim 26, wherein compensating for temperature variations is achieved by natural variations in the bias current in response to variations in temperature.

30. A method according to claim 27, wherein the bias current provided to the first amplification stage is additionally proportional to absolute temperature (PTAT).

31. A method according to claim 26, comprising the step of:

increasing of the bias current provided to the first amplification stage between the first predetermined potential and the second predetermined potential, the increasing in the bias current resulting in the second amplification stage to smoothly transition its mode of operation from the linear mode of operation to the saturation mode of operation.

32. A method according to claim 31, wherein the second gain of the second amplification stage is substantially fixed during the step of increasing of the bias current.

* * * * *